(12) United States Patent
Ishizuka et al.

(10) Patent No.: US 9,944,561 B2
(45) Date of Patent: Apr. 17, 2018

(54) DIELECTRIC MATERIAL AND ELECTROSTATIC CHUCKING DEVICE

(71) Applicant: Sumitomo Osaka Cement Co., Ltd, Tokyo (JP)

(72) Inventors: Masayuki Ishizuka, Tokyo (JP); Hiroaki Nagatomo, Tokyo (JP)

(73) Assignee: SUMITOMO OSAKA CEMENT CO., LTD. (JP)

( * ) Notice: Subject to any disclaimer, the term of this patent is extended or adjusted under 35 U.S.C. 154(b) by 68 days.

(21) Appl. No.: 15/120,150

(22) PCT Filed: Mar. 9, 2015

(86) PCT No.: PCT/JP2015/056799
§ 371 (c)(1),
(2) Date: Aug. 19, 2016

(87) PCT Pub. No.: WO2015/137270
PCT Pub. Date: Sep. 17, 2015

(65) Prior Publication Data
US 2017/0057875 A1    Mar. 2, 2017

(30) Foreign Application Priority Data
Mar. 10, 2014 (JP) .................. 2014-046815

(51) Int. Cl.
*C04B 35/117* (2006.01)
*C04B 35/626* (2006.01)
(Continued)

(52) U.S. Cl.
CPC ............ *C04B 35/117* (2013.01); *C04B 35/01* (2013.01); *C04B 35/14* (2013.01); *C04B 35/185* (2013.01);
(Continued)

(58) Field of Classification Search
CPC ....... C04B 35/01; C04B 35/14; C04B 35/177; C04B 35/185; C04B 35/44; C04B 35/488;
(Continued)

(56) References Cited

U.S. PATENT DOCUMENTS

2003/0123213 A1   7/2003   Kosakai
2006/0199722 A1   9/2006   Aihara et al.
2013/0120896 A1   5/2013   Ono

FOREIGN PATENT DOCUMENTS

JP    H10275524 A     10/1998
JP    2000107969 A    4/2000
(Continued)

OTHER PUBLICATIONS

International Search Report for PCT/JP2015/056799 (dated Jun 2, 2015).
(Continued)

*Primary Examiner* — Thienvu Tran
*Assistant Examiner* — Kevin J Comber
(74) *Attorney, Agent, or Firm* — Merchant & Gould P.C.

(57) ABSTRACT

A dielectric material includes a composite sintered body in which conductive particles are dispersed in an insulating material, in which a dielectric constant at a frequency of 40 Hz is 10 or higher, and a difference between a maximum dielectric loss value and a minimum dielectric loss value at a frequency of 1 MHz in a surface of the composite sintered body is 0.002 or less.

5 Claims, 1 Drawing Sheet

(51) Int. Cl.
| | |
|---|---|
| *C04B 35/645* | (2006.01) |
| *H01L 21/683* | (2006.01) |
| *H02N 13/00* | (2006.01) |
| *H01B 3/00* | (2006.01) |
| *C04B 35/01* | (2006.01) |
| *C04B 35/14* | (2006.01) |
| *C04B 35/185* | (2006.01) |
| *C04B 35/44* | (2006.01) |
| *C04B 35/488* | (2006.01) |
| *C04B 35/495* | (2006.01) |
| *C04B 35/50* | (2006.01) |
| *C04B 35/505* | (2006.01) |
| *C04B 35/581* | (2006.01) |
| *C04B 35/583* | (2006.01) |
| *C04B 35/584* | (2006.01) |
| *C04B 35/78* | (2006.01) |

(52) U.S. Cl.
CPC ............ *C04B 35/44* (2013.01); *C04B 35/488* (2013.01); *C04B 35/495* (2013.01); *C04B 35/50* (2013.01); *C04B 35/505* (2013.01); *C04B 35/581* (2013.01); *C04B 35/583* (2013.01); *C04B 35/584* (2013.01); *C04B 35/6261* (2013.01); *C04B 35/6264* (2013.01); *C04B 35/62625* (2013.01); *C04B 35/62655* (2013.01); *C04B 35/645* (2013.01); *C04B 35/6455* (2013.01); *C04B 35/78* (2013.01); *H01B 3/004* (2013.01); *H01L 21/6833* (2013.01); *H02N 13/00* (2013.01); *C04B 2235/3217* (2013.01); *C04B 2235/3225* (2013.01); *C04B 2235/3826* (2013.01); *C04B 2235/404* (2013.01); *C04B 2235/422* (2013.01); *C04B 2235/5445* (2013.01); *C04B 2235/5472* (2013.01); *C04B 2235/606* (2013.01); *C04B 2235/658* (2013.01); *C04B 2235/6567* (2013.01); *C04B 2235/66* (2013.01); *C04B 2235/764* (2013.01); *C04B 2235/80* (2013.01)

(58) Field of Classification Search
CPC ..... C04B 35/495; C04B 35/50; C04B 35/505; C04B 35/581; C04B 35/583; C04B 35/584; C04B 35/6261; C04B 35/62625; C04B 35/6264; C04B 35/62655; C04B 35/645; C04B 35/6455; C04B 35/78; C04B 2235/3217; C04B 2235/3225; C04B 2235/3826; C04B 2235/404; C04B 2235/422; C04B 2235/5445; C04B 2235/606; C04B 2235/6567; C04B 2235/658; C04B 2235/66; C04B 2235/764; C04B 2235/80; H01B 3/004; H01L 21/6833; H02N 13/00
USPC ........................................................ 361/234
See application file for complete search history.

(56) References Cited

FOREIGN PATENT DOCUMENTS

| | | |
|---|---|---|
| JP | A-2001-130968 | 5/2001 |
| JP | 2003040674 A | 2/2003 |
| JP | 2003152065 A | 5/2003 |
| JP | 2005-203734 A | 7/2005 |
| JP | 2006225185 A | 8/2006 |
| JP | A-2007-051045 | 3/2007 |
| JP | 2008266095 A | 11/2008 |
| JP | 2011-020081 A | 2/2011 |
| JP | 2013258429 A | 12/2013 |
| WO | 2012014873 A1 | 2/2012 |

OTHER PUBLICATIONS

International Search Report of PCT/JP2015/056799 dated Jun. 2, 2015.
Office Action for Japanese Patent Application No. 2015-515734 (dated Aug. 9, 2016).
Office Action for Japanese Patent Application No. 2015-515734 (dated Dec. 6, 2016).

DIELECTRIC MATERIAL AND ELECTROSTATIC CHUCKING DEVICE

TECHNICAL FIELD

The present invention relates to a dielectric material and an electrostatic chucking device.

This application is a U.S. National Stage Application under 35 U.S.C. § 371 of International Application No. PCT/JP2015/056799 filed Mar. 9, 2015, which claims the benefit of priority to based on Japanese Patent Application No. 2014-046815 filed on Mar. 10, 2014, the contents of all of which are hereby incorporated by reference in their entireties.

BACKGROUND ART

Recently, in a semiconductor manufacturing process, further improvement in a microfabrication technique has been required along with an increase in element integration density and performance. In the semiconductor manufacturing process, an etching technique is one of the important microfabrication techniques. Recently, among the etching techniques, a plasma etching technique capable of microfabrication on a large area with high efficiency has been mainly used.

This plasma etching technique is a dry etching technique. Specifically, a mask pattern is formed on a solid material as a workpiece through a resist. Next, in a state where this solid material is supported in a vacuum, a reactive gas is introduced into this vacuum, and a high-frequency electric field is applied to the reactive gas. As a result, accelerated electrons collide against gas molecules to be in a plasma state. Next, radicals (free radicals) produced from the plasma and ions are caused to react with the solid material so as to be removed as a reaction product. As a result, a fine pattern is formed on the solid material.

On the other hand, in a plasma CVD method which is a thin film forming technique, a compound, which is obtained by plasma causing raw material gases to combine with each other, is deposited on a substrate. In this method, a high-frequency electric field is applied to gases containing raw material molecules to discharge plasma. The raw material molecules are decomposed by electrons accelerated by the plasma discharge to obtain a compound, and the obtained compound is deposited on a substrate. A reaction, which does not occur only with thermal excitation at a low temperature, may occur in plasma because gases in the system collide against each other and are activated into radicals.

In a semiconductor manufacturing device using plasma such as a plasma etching device or a plasma CVD device, in the related art, an electrostatic chucking device is used as a device which simply attaches and fixes a wafer as a workpiece to a sample stage and maintains the wafer at a desired temperature.

This electrostatic chucking device includes: a substantially disk-shaped dielectric plate on which a wafer is placed; and an electrode for electrostatic adsorption that is embedded in the dielectric plate. By applying a direct current voltage between the dielectric plate and the wafer placed on the dielectric plate, an electrostatic adsorption force is generated due to the Coulomb force or a small leakage current. Due to this electrostatic adsorption force, the wafer is fixed to the dielectric plate.

As the dielectric plate used in the electrostatic chucking device, a ceramic such as aluminum oxide, aluminum nitride, or yttrium oxide is generally used.

As such an electrostatic chucking device, for example, an electrostatic chucking device is disclosed in which a base body of an electrostatic chuck includes a ceramic member which is formed of a yttrium oxide sintered body, the yttrium oxide sintered body including 5 vol % to 40 vol % of silicon nitride, and the ceramic member having a volume resistivity of $1\times10^{15}$ Ω·cm or higher at room temperature and a relative dielectric constant of 10 or higher. As a result, high adsorption force and satisfactory desorption response of a workpiece are realized (Patent Citation 1).

In addition, in order to improve the yield and reliability of a chip in a semiconductor process, it is necessary to reduce an in-plane variation in the surface temperature of a wafer. Therefore, an electrostatic chuck is disclosed in which a semiconductor substrate such as a silicon wafer can be uniformly processed by using an aluminum nitride sintered body. In this aluminum nitride sintered body, when measured at plural measurement points including the center and an outer periphery of a surface of a wafer, an average relative density is 98% or higher, an average volume specific resistance value at 50° C. is $10^7$ Ω·cm to $10^{12}$ Ω·cm, an average dielectric loss at a frequency of 1 MHz is $50\times10^{-4}$ or lower, and a difference between a maximum dielectric loss value and a minimum dielectric loss value is 50% or lower of the average dielectric loss (Patent Citation 2).

On the other hand, as an electrostatic chuck in which the power of suppressing residual adsorption is not likely to deteriorate over time, an electrostatic chuck in which an insulating substrate formed of aluminum oxide or aluminum nitride is used is disclosed (Patent Citation 3).

In this electrostatic chuck, by controlling the dielectric loss of the material used for the insulating substrate to be $1\times10^{-4}$ or lower, the temperature distribution on the surface of the insulating substrate is improved. As a result, non-uniformity in the surface temperature is improved.

[Patent Citation 1] Japanese Laid-open Patent Publication No. 2006-225185

[Patent Citation 2] Japanese Laid-open Patent Publication No. 2003-40674

[Patent Citation 3] Pamphlet of International Re-Publication No. WO2012/014873

DISCLOSURE OF INVENTION

Technical Problem

However, in the yttrium oxide sintered body including silicon nitride disclosed in Patent Citation 1, the adsorption force is satisfactory; however, in a case where silicon nitride is unevenly distributed in the sintered body, a variation in dielectric loss increases. Due to this variation, the amount of heat generated by a high-frequency voltage varies in a surface of the sintered body. As a result, there is a difference in the in-plane temperature of a workpiece. Therefore, various processes are non-uniform, the probability of a defective product increases, and thus there is a problem in that the reliability of the obtained product deteriorates. In addition, yttrium oxide is a rare earth oxide and thus has a problem in that it is more expensive than other metal oxides or the like.

In addition, in the aluminum nitride sintered body disclosed in Patent Citation 2, the variation in dielectric loss is small, but the volume resistance value is low. Therefore, the withstand voltage is low. Accordingly, there is a problem in that a workpiece may be broken by a leakage current or breakdown.

In addition, in the electrostatic chuck disclosed in Patent Citation 3, a high-purity insulating material such as aluminum oxide or aluminum nitride is used. Therefore, although a uniform temperature distribution is obtained, the dielectric constant is low, and thus there is a problem in that high adsorption force cannot be obtained.

Accordingly, when the volume resistance value is high, charges exhibiting adsorption force are difficult to escape, and thus there is a problem in that the desorption response deteriorates.

Further, in a substance in which a conductive material is dispersed in a second layer, the second layer causes an increase in dielectric loss. Therefore, the electrostatic adsorption force increases excessively, and thus it is difficult to realize an electrostatic chuck in which electrostatic adsorption force and uniformity in the in-plane temperature of a workpiece are well-balanced.

The present invention has been made in consideration of the above-described circumstances, and an object thereof is to provide: an inexpensive dielectric material in which sufficient electrostatic adsorption force, satisfactory desorption response, and high withstand voltage are obtained and in which there is no temperature difference in a surface of a composite sintered body; and an electrostatic chucking device in which a base body is formed of the dielectric material.

Technical Solution

In order to solve the above-described problems, the present inventors performed thorough investigation, thereby providing the present invention. That is, the present inventors found that: the electrostatic adsorption force, desorption response, and withstand voltage are improved by controlling the dielectric constant and a difference between a maximum dielectric loss value and a minimum dielectric loss value in a composite sintered body in which conductive particles are dispersed in an insulating material; and the electrostatic adsorption force, desorption response, and withstand voltage are further improved and there is no temperature difference in a surface of the composite sintered body by minimizing a temperature difference in the surface of the composite sintered body and further controlling the volume resistivity, withstand voltage, thermal conductivity, and the like. Based on the findings, the present invention has been completed.

That is, according to a first aspect of the present invention, there is provided a dielectric material, wherein the dielectric material is a composite sintered body in which conductive particles are dispersed in an insulating material, a dielectric constant of the dielectric material at a frequency of 40 Hz is 10 or higher, and a difference between a maximum value and a minimum value of dielectric loss of the dielectric material wherein the dielectric loss is measured at a frequency of 1 MHz on the surface of the composite sintered body is 0.002 or less.

It is preferable that the dielectric material has the following characteristics.

In the dielectric material, it is preferable that a volume resistivity at 20° C. of the dielectric material is $10^{13}$ Ω·cm or higher, and a withstand voltage at 20° C. of the dielectric material is 5 kV/mm or higher.

In the dielectric material, it is preferable that a volume resistivity at 120° C. of the dielectric material is $10^{13}$ Ω·cm or higher and a withstand voltage at 20° C. of the dielectric material is 5 kV/mm or higher.

In the dielectric material, it is preferable that a thermal conductivity of the dielectric material is 20 W/m·K or higher.

In the dielectric material, it is preferable that dielectric loss at a frequency of 40 Hz of the dielectric material is 0.01 or higher and 0.05 or lower.

According to a second aspect of the present invention, there is provided an electrostatic chucking device comprising a base having a main surface on which a plate-like sample is electrostatically attracted, and the base is formed of the dielectric material according to the first aspect of the present invention. It is preferable that the base body is formed of the dielectric material.

Advantageous Effects

In the dielectric material according to the present invention, the dielectric constant of a composite sintered body, which is obtained by dispersing the conductive particles in the insulating material, at a frequency of 40 Hz is 10 or higher, and a difference between a maximum dielectric loss value and a minimum dielectric loss value at a frequency of 1 MHz in a surface of the composite sintered body is 0.002 or less. In this way, by controlling the dielectric constant of the composite sintered body and a difference between a maximum dielectric loss value and a minimum dielectric loss value in the composite sintered body, the electrostatic adsorption force, desorption response, and withstand voltage can be improved, and a temperature difference in the surface of the composite sintered body can be minimized. Accordingly, the reliability of the dielectric material can be improved.

In addition, in the dielectric material, one or plural characteristics are suitably controlled among the volume resistivity, the withstand voltage, the thermal conductivity, and the dielectric loss at a frequency of 40 Hz. As a result, the electrostatic adsorption force, desorption response, and withstand voltage can be further improved, and a temperature difference in a surface of the composite sintered body can be eliminated. Accordingly, the reliability of the dielectric material can be maintained for a long period of time.

In the electrostatic chucking device according to the present invention, the base body, on which a plate-shaped sample is electrostatically adsorbed, is formed of the dielectric material according to the present invention. Therefore, the electrostatic adsorption force and desorption response of the plate-shaped sample can be improved, and the withstand voltage of the base body can be improved. Further, a temperature difference in a first main surface of the base body on which a plate-shaped sample is electrostatically adsorbed can be minimized. Accordingly, various processes can be uniformly performed on the entire region of the plate-shaped sample, and the reliability of the obtained product can be improved.

BEST MODE FOR CARRYING OUT THE INVENTION

Figure 1:
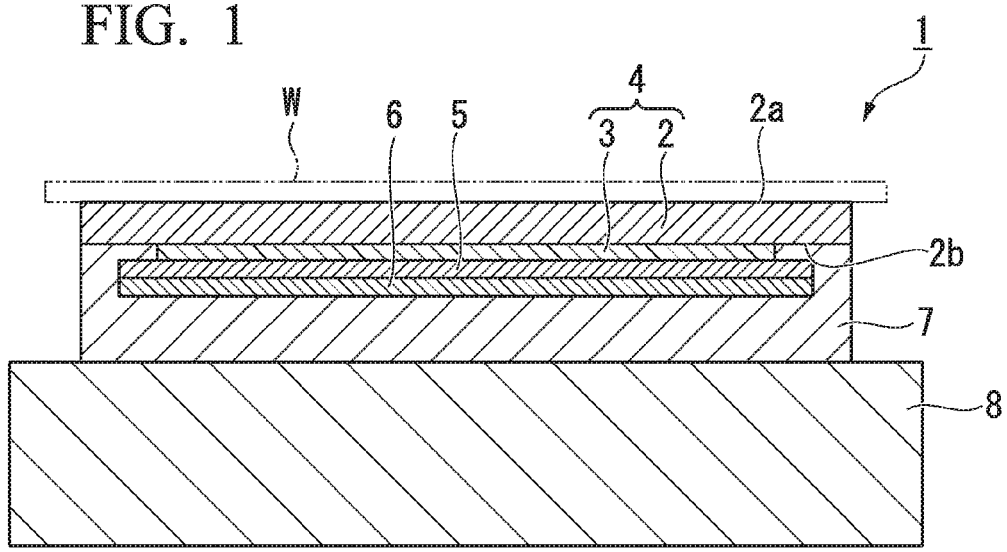
FIG. 1 is a cross-sectional view showing an example of an electrostatic chucking device according to an embodiment of the present invention.

A preferable embodiment of a dielectric material and an electrostatic chucking device according to the present invention will be described based on the drawings.

The embodiment will be described in detail for easy understanding of the concept of the present invention, but the present invention is not limited thereto unless specified otherwise.

The present invention relates to a dielectric material and an electrostatic chucking device. More specifically, the present invention is suitably used for an etching device which is applied to a manufacturing process of a semiconductor device, a liquid crystal display device, or the like and for a vacuum processing device such as a sputtering device or CVD device. In the device according to the present invention, the adsorption force of a workpiece such as a plate-shaped sample is high, and when a high frequency is applied to a placement surface on which the workpiece is placed, the temperature uniformity is satisfactory. As a result, a decrease in the yield of, for example, the obtained semiconductor device or liquid crystal display device can be prevented.

[Dielectric Material]

The dielectric material according to the embodiment includes a composite sintered body in which conductive particles are dispersed in an insulating material. A dielectric constant at a frequency of 40 Hz is 10 or higher, and a difference between a maximum dielectric loss value and a minimum dielectric loss value at a frequency of 1 MHz in a surface of the composite sintered body is 0.002 or less.

Examples of the insulating material include insulating ceramics and various organic resins such as a polyimide resin or a silicon resin. The organic resins have a problem in that insulating characteristics are likely to deteriorate due to heat generation.

Therefore, in the embodiment, an insulating ceramic is used in which insulating characteristics are not likely to deteriorate due to heat generation. However, the insulating material is not limited to the insulating ceramic, and another material may be used.

Examples of the insulating ceramic include oxides such as aluminum oxide ($Al_2O_3$), yttrium oxide ($Y_2O_3$), silicon oxide ($SiO_2$), zirconium oxide ($ZrO_2$), mullite ($3Al_2O_3 \cdot 2SiO_2$), hafnium oxide ($HfO_2$), scandium oxide ($Sc_2O_3$), neodymium oxide ($Nd_2O_3$), niobium oxide ($Nb_2O_5$), samarium oxide ($Sm_2O_3$), ytterbium oxide ($Yb_2O_3$), erbium oxide ($Er_2O_3$), and cerium oxide ($CeO_2$). Among these oxides, one kind may be used alone, or a mixture of two or more kinds may be used as the composite oxide.

Other examples of the insulating ceramic include nitrides such as aluminum nitride (AlN), silicon nitride ($Si_3N_4$), and boron nitride (BN). Among these nitrides, one kind may be used alone, or a composite nitride which is a mixture of two or more kinds may be used. However, from the viewpoint of chemical stability, it is preferable that one kind is used alone.

Among these insulating ceramics, in particular, aluminum oxide ($Al_2O_3$) is preferable as the dielectric material according to the embodiment because the heat resistance is high and, in a case where conductive particles are dispersed in aluminum oxide ($Al_2O_3$) to obtain a composite sintered body, the mechanical characteristics are also satisfactory.

Here, in a case where it is desired to reduce the content of aluminum (Al) in the insulating ceramic or to further improve corrosion resistance, an insulating ceramic such as yttrium oxide ($Y_2O_3$) or yttrium-aluminum-garnet (YAG; $3Y_2O_3 \cdot 5Al_2O_3$) may also be used.

The average particle diameter of the insulating ceramic may be appropriately set and, for example, is 1 µm or less. For example, the lower limit of the average particle diameter may be 0.001 µm, 0.01 µm, or 0.05 µm. The upper limit may be 1 µm, 0.7 µm, or 0.5 µm.

In a case where aluminum oxide ($Al_2O_3$) as the insulating ceramic, it is preferable that, although not particularly limited thereto, a raw material powder of aluminum oxide ($Al_2O_3$) has an average particle diameter of 1 µm or less and has high purity. The average particle diameter of the raw material powder may be appropriately set and, for example, is 1 µm or less. For example, the lower limit of the average particle diameter may be 0.001 µm, 0.01 µm, or 0.05 µm. The upper limit may be 1 µm or 0.5 µm.

The average particle diameter is the average primary particle diameter obtained by measurement using an SEM image.

Here, the reason why the average particle diameter of the aluminum oxide ($Al_2O_3$) powder is preferably 1 µm or less is as follows. When the average particle diameter of the aluminum oxide powder is more than 1 µm, the average particle diameter of aluminum oxide particles in an aluminum oxide sintered body which is obtained by calcinating the aluminum oxide powder is more than 2 µm. When a base body of an electrostatic chucking device is prepared using the sintered body, a top surface of the base body on which a plate-shaped sample is placed is likely to be etched by plasma, and a sputter crater may be formed on the top surface of the base body. As a result, in some cases, a workpiece such as a silicon wafer may be contaminated.

The conductive particles are not particularly limited as long as they can be dispersed in the insulating material (insulating particles) without deteriorating the electrical characteristics of the insulating material. It is preferable that the conductive particles are one kind of particles or two or more kinds of particles selected from the group consisting of conductive ceramic particles such as silicon carbide (SiC) particles, high melting point metal particles such as molybdenum (Mo) particles, tungsten (W) particles, and tantalum (Ta) particles, and carbon (C) particles. In particular, conductive particles are preferably used because they do not produce a solid solution or a reaction product with the insulating material (insulating particles).

Here, it is not preferable that the conductive particles produce a solid solution or a reaction product with the insulating material (insulating particles) because changes in electrical characteristics depending on temperature are significant, and thus a volume resistivity at 120° C. of $10^{13}$ Ω·cm or higher and a withstand voltage of 5 kV/mm or higher cannot be obtained. Accordingly, in the present invention, it is preferable that the composite sintered body is not a solid solution or a reaction product of the conductive particles and the insulating material.

However, in a case where a non-conductive component such as an oxide layer, which is unavoidably present on surfaces of the conductive particle and the like, forms a solid solution or a reaction product with the insulating material (insulating particles), the solid solution or the reaction product has no effect on the electrical characteristics of the conductive particles and thus do not cause any problems.

Among the conductive particles, silicon carbide (SiC) particles are a semiconductor and thus are conductive. Therefore, it is preferable that silicon carbide (SiC) particles are combined with aluminum oxide ($Al_2O_3$) particles because the obtained composite sintered body has small temperature dependence of the electrical characteristics, has satisfactory corrosion resistance to halogen gas, has high heat resistance and thermal shock resistance, and is not likely to be damaged by thermal stress even when used at a high temperature.

It is preferable that the silicon carbide (SiC) particles have a β type crystal structure from the viewpoint of obtaining satisfactory conductivity. In order to control the conductivity of the silicon carbide particles to be in an appropriate range, it is preferable to appropriately control the content rate of nitrogen as an impurity in the silicon carbide particles.

The silicon carbide (SiC) particles can be obtained using various methods such as a plasma CVD method, a precursor method, a carbothermal reduction method, or a laser pyrolysis method. In particular, in a case where the dielectric material according to the embodiment is used in a semiconductor process, it is preferable that the dielectric material has high purity in order to prevent an adverse effect caused by the dielectric material, for example, contamination in a semiconductor process.

As the conductive particles used as a raw material for manufacturing the composite sintered body, mixed conductive particles obtained by mixing plural kinds of particles having different average particle diameters, for example, two, three, or four kinds of particles with each other.

In one example, it is preferable that the mixed conductive particles include conductive particles having a particle diameter of 40 nm or less and conductive particles having a particle diameter of 80 nm or more. The amount of the conductive particles having a particle diameter of 40 nm or less can be selected arbitrarily, but is preferably 1% by mass to 40% by mass and more preferably 20% by mass to 40% by mass.

The amount of the conductive particles having a particle diameter of 80 nm or more can be selected arbitrarily, but is preferably 1% by mass to 40% by mass and more preferably 20% by mass to 40% by mass. In addition, in a case where a particle diameter distribution of the mixed conductive particles is measured, it is preferable that a curve of the content rate of a cumulative particle diameter is smooth with respect to the particle diameter but may have plural peaks as necessary.

It is also preferable that the mixed conductive particles further include conductive particles having a particle diameter of more than 40 nm and less than 80 nm. The amount of the conductive particles having a particle diameter of more than 40 nm and less than 80 nm can be selected arbitrarily, but is preferably 20% by mass to 98% by mass and more preferably 20% by mass to 60% by mass.

As a specific example of the mixed conductive particles, mixed particles obtained by mixing SiC particles having an average particle diameter of 0.03 SiC particles having an average particle diameter of 0.05 μm, and SiC particles having an average particle diameter of 0.1 μm with each other at a mass ratio of 1:1:1 is preferably used.

The average particle diameter is the particle diameter obtained by measurement using a TEM image.

In this way, by horizontally widening the particle diameter distribution of the conductive particles used as the raw material, there is little effect of the temperature history during calcination, a calcination atmosphere, and the like. Accordingly, a change in the microstructure of the conductive particles as the obtained sintered body is suppressed. As a result, regarding a state where the conductive particles are dispersed in the composite sintered body, there is no difference between the center and the outer periphery of the composite sintered body. Accordingly, uniform dielectric loss can be obtained in a surface of the composite sintered body.

The content rate of the conductive particles in the dielectric material is preferably 4% by mass or higher and 20% by mass or lower, more preferably 5% by mass or higher and 20% by mass or lower, and still more preferably 5% by mass or higher and 12% by mass or lower.

Here, the reason for controlling the content rate of the conductive particles to be in the above-described range is as follows. It is not preferable that the content rate of the conductive particles is lower than 4% by mass because the amount of the conductive particles is excessively small with respect to the amount of the insulating material, and thus satisfactory conductivity may not be obtained.

On the other hand, it is not preferable that the content rate of the conductive particles is higher than 20% by mass because the amount of the conductive particles is excessively large with respect to the amount of the insulating material, and withstand voltage characteristics of the dielectric material may deteriorate.

In addition, when the content rate of the conductive particles is higher than 20% by mass, the conductive particles are likely to agglomerate. Therefore, due to the aggregation, abnormal particle growth during calcination, and the like, the particle diameter of the conductive particles is likely to increase. In some cases, the amount of conductive particle having a particle diameter of 2 μm or more is likely to increase. When the dielectric material, that is, the composite sintered body is prepared by forming and calcination using the above coarse particles, a top surface of the composite sintered body on which a plate-shaped sample is placed is likely to be etched by plasma. Accordingly, a sputter crater is likely to be formed on the top surface of the composite sintered body, which causes the contamination of a plate-shaped sample such as a silicon wafer.

In the dielectric material according to the present invention, it is important that a solid solution or a compound, which is produced by a reaction of the conductive particles and the insulating material, is not present in the composite sintered body obtained by forming and calcination.

The content rate of the conductive particles in the dielectric material varies depending on the kind and required characteristics of the insulating material used. Therefore, it is preferable to optimize the content rate of the conductive particles in the above-described range depending on the kind and required characteristics of the insulating material used.

[Electrical Characteristics of Dielectric Material]
(1) Dielectric Constant and Dielectric Loss The dielectric constant and dielectric loss of the dielectric material can be measured using a dielectric constant measuring device, for example, a dielectric constant measuring system 126096W (manufactured by Toyo Corporation).

In the dielectric material according to the present invention, the dielectric constant at a frequency of 40 Hz is preferably 10 or higher, more preferably 12 or higher, and still more preferably 13 or higher. The upper limit value can be selected arbitrarily without any particular limitation and is, for example, 200 or lower and 150 or lower.

Here, the reason for limiting the frequency to 40 Hz is as follows. The dielectric material actually exhibits electrostatic adsorption force in a case where a direct current voltage is applied thereto. However, there is no simple method of measuring a dielectric constant at a direct current voltage. Accordingly, a method of measuring a dielectric constant at an alternating current voltage is adopted, and the frequency at this time is set as 40 Hz which is actually the lowest frequency.

In addition, the reason for limiting the dielectric constant at a frequency of 40 Hz to be 10 or higher is as follows. The high-dielectric constant of the dielectric material correlates to the amount of charges generated from the surface for exhibiting adsorption force in a case where a voltage is applied to the dielectric material. As the dielectric constant increases, the adsorption force increases. In particular, in a Coulomb type electrostatic chucking device having a volume resistance value of $10^{13}$ Ω·cm or higher, when the dielectric constant is 10 or higher, sufficient adsorption force can be obtained. In this electrostatic chucking device, by further controlling the dielectric constant to be 12 or higher, satisfactory adsorption characteristics can be obtained even in a case where a protrusion or a groove is formed on a surface of the electrostatic chucking device.

In the dielectric material according to the present invention, it is preferable that a difference between a maximum dielectric loss value and a minimum dielectric loss value at a frequency of 1 MHz in a surface of the composite sintered body is 0.002 or less.

The reason for limiting the frequency to 1 MHz is as follows. In a semiconductor manufacturing device such as a plasma treatment device in which the electrostatic chucking device is used, a high frequency at which plasma is generated is 13.56 MHz or several tens of MHz. Therefore, the dielectric material requires dielectric characteristics at a high frequency rather than dielectric constant affecting adsorption characteristics.

The size of the dielectric loss is proportional to the amount of heat generated from the dielectric material when a high frequency is applied to the dielectric material. As the frequency increases, the dielectric loss increases.

Here, there is no problem in practice because the entire region of the dielectric material has the same dielectric loss and, at the same amount of heat generation, the temperature can be controlled using a heating device or a cooling device which is provided in an electrostatic chucking device. However, in a case where the dielectric loss varies depending on portions of the dielectric material, the amount of heat generation varies depending on measurement positions of the dielectric material. Therefore, the temperature cannot be controlled using a heating device or a cooling device, and a temperature distribution is generated in a plate-shaped material, which is not preferable.

In consideration of the above points, the upper limit of a variation width of the dielectric loss where a temperature distribution is not generated in the dielectric material is 0.002. Therefore, by setting the variation in the dielectric loss to be 0.002 or less, in a case where the dielectric loss is high, a uniform temperature distribution can be obtained.

(2) Numerical Range of Dielectric Loss

In the dielectric material according to the present invention, a dielectric loss at a frequency of 40 Hz is 0.01 or higher and 0.05 or lower.

Here, the reason for limiting the dielectric loss at a frequency of 40 Hz to be in the above-described range is as follows. In a case where the dielectric loss at a frequency of 40 Hz is 0.01 or higher, when a plate-shaped material is desorbed by stopping voltage application, charges exhibiting adsorption force are likely to be eliminated by dielectric loss.

In particular, in a Coulomb type electrostatic chucking device having a volume resistance value of $10^{13}$ Ω·cm or higher, the elimination of charges caused by a leakage current cannot be expected. In order to obtain satisfactory desorption characteristics, it is preferable that the dielectric loss is 0.01 or higher.

On the other hand, when the dielectric loss at a frequency of 40 Hz is higher than 0.05, in a case where a high-frequency voltage is applied to the dielectric material, heat may be generated by this application. Therefore, a temperature increase caused by the heat generation may not be controlled using a heating device or a cooling device generally provided in an electrostatic chucking device, which is not preferable.

As described above, in the dielectric material whose dielectric loss is controlled, a variation in dielectric loss is extremely small. Therefore, for example, in a case where the dielectric material according to the present invention is used as a base body of an electrostatic chucking device, adsorption characteristics and desorption characteristics are satisfactory, a plate-shaped sample can be uniformly processed, and the productivity can be improved.

(3) Volume Resistivity

The volume resistivity of the dielectric material can be measured using a three-terminal method.

It is preferable that the volume resistivity of the dielectric material is $10^{13}$ Ω·cm or higher at both 20° C. and 120° C. The reason for this is as follows. When the volume resistivity is $10^{13}$ Ω·cm or higher, by applying a voltage to the dielectric material, charges exhibiting adsorption force are generated on the surface such that a Coulomb type electrostatic chucking device can function. On the other hand, when the volume resistivity is lower than $10^{13}$ Ω·cm, due to the voltage applied to the dielectric material, charges move in the dielectric material, and thus there are defects such as the generation of a leakage current or a decrease in withstand voltage, which is not preferable. The upper limit of the volume resistivity of the dielectric material can be selected arbitrarily, but is preferably $10^{15}$ Ω·cm or lower.

(4) Withstand Voltage

The withstand voltage of the dielectric material at both 20° C. and 120° C. is preferably 5 kV/mm or higher, more preferably 7 kV/mm or higher, and still more preferably 8 kV/mm or higher. Here, the reason for limiting the withstand voltage to be 5 kV/mm or higher is as follows. When the withstand voltage is lower than 5 kV/mm, in a case where the dielectric material is used in an electrostatic chucking device, the voltage for adsorption cannot be increased to be 5 kV/mm or higher, sufficient adsorption force may not be obtained. The upper limit value can be selected arbitrarily, but is preferably 20 kV/mm or lower and may be 15 kV/mm or lower.

(5) Thermal Conductivity

The thermal conductivity of the dielectric material is preferably 20 W/m·K or higher and more preferably 25 W/m·K or higher.

Here, the reason for limiting the thermal conductivity to be 20 W/m·K or higher is as follows. When the thermal conductivity is lower than 20 W/m·K, in a case where the dielectric material is used in an electrostatic chucking device, the temperature of a heating device or a cooling device generally provided in the electrostatic chucking device cannot be uniformly transferred into an adsorption surface. The upper limit value can be selected arbitrarily, but is preferably 50 W/m·K or lower.

[Method of Manufacturing Dielectric Material]

The dielectric material according to the embodiment can be manufactured using a method including: mixing a raw material powder of the insulating material, a raw material powder of the conductive particles, and a dispersion medium with each other to form a slurry; drying the slurry by spraying to obtain a granulated body; and calcinating the granulated body under a pressure of 1 MPa or higher and 100 MPa or lower.

Next, this manufacturing method will be described in detail.

First, a raw material powder of the insulating material, a raw material powder of the conductive particles, and a dispersion medium are mixed with each other to form a slurry.

As a dispersion medium used in this slurry, water and an organic solvent can be used.

Examples of the organic solvent which can be preferably used include: monohydric alcohols such as methanol, ethanol, 2-propanol, butanol, and octanol, and modified products thereof; alcohols belonging to monocyclic monoterpene such as α-terpineol; carbitols such as butyl carbitol; esters such as ethyl acetate, butyl acetate, ethyl lactate, propylene glycol monomethyl ether acetate, propylene glycol monoethyl ether acetate, butyl carbitol acetate, and γ-butyrolactone; ethers such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetyl acetone, and cyclohexanone, aromatic hydrocarbons such as benzene, toluene, xylene, and ethyl benzene; and amides such as dimethylformamide, N,N-dimethylacetamide, and N-methylpyrrolidone.

Among these organic solvents, one kind may be used alone, or a mixture of two or more kinds may be used.

During the preparation of this slurry, a dispersant or a binder may be added.

Examples of the dispersant or the binder which can be preferably used include: polycarboxylates such as ammonium polycarboxylate; and organic polymers such as polyethylene glycol, polyvinyl alcohol, and polyvinyl pyrrolidone.

In order to reduce a variation in the dielectric loss in the obtained dielectric material, it is important to uniformly disperse fine particles, into which an agglomerate produced in the slurry is crushed, in the dielectric material.

In order to crush the produced agglomerate, a method of dispersing and stirring the slurry under a high pressure, preferably, a method of causing particles of the slurry to collide against each other is preferable.

At this time, the pressure is preferably 100 Mpa or higher and 250 MPa or lower. The reason for this is as follows. In order to crush the produced agglomerate, a pressure of 100 MPa or higher is necessary. On the other hand, in consideration of the mechanical strength of the device, the limit of the pressure is 250 MPa.

During the dispersing, a disperser such as an ultrasonic homogenizer or a bead mill is preferable.

When the raw material powder of the insulating particles and the raw material powder of the conductive particles are non-uniformly mixed with each other, a distribution of the conductive particles in the dielectric material, which is obtained by conjugation using the slurry in which the materials are non-uniformly mixed with each other, becomes non-uniform. Therefore, the reproduction of electrical characteristics such as dielectric loss and the uniformity of the composition in the sintered body may deteriorate. Accordingly, it is preferable that the materials are uniformly mixed with each other by selecting a dispersion medium, a dispersant, and dispersing conditions.

Next, this slurry is dried using a spray drying method. A spray drying device can be selected arbitrarily but, for example, a spray dryer is preferably used.

Here, the slurry is dried by being sprayed in an heated air flow. As a result, in a state where the insulating material and the conductive particle in the slurry are uniformly dispersed, only the dispersion medium is scattered and lost, and thus a granulated body (granulated powder) in which the conductive particles are uniformly dispersed in the insulating material is obtained. At this time, the average particle diameter of the granulated body is preferably 30 μm to 150 μm and more preferably 50 μm to 100 μm. This average particle diameter is a value measured using a vibrating sieve.

Next, this granulated body is formed into a body having a predetermined shape using a method which can be selected from typical forming methods. For example, in order to manufacture a dielectric material used in a base body of an electrostatic chucking device, it is necessary to set the shape and thickness of the body in consideration of the shape and thickness of a composite sintered body which is obtained by forming and calcination.

Next, this body is calcinated. In this embodiment, the body is interposed between plates, preferably, carbon plates having a flatness of 0.2 mm or less. Here, the reason for limiting the flatness of the plates to be 0.2 mm or less is as follows. When a concavo-convex portion having a size of more than 0.2 mm is present on the surface of the plate, the pressure applied to the body is non-uniform, the sintered density of the obtained composite sintered body varies due to the non-uniform pressure application. This variation in the sintered density causes a variation in electrical characteristics such as dielectric loss.

Next, the body interposed between the plates is calcinated in a predetermined calcination atmosphere under a pressure which can be selected arbitrarily, preferably under 1 MPa or higher and 100 MPa or lower and more preferably under 5 MPa or higher and 50 MPa or lower. As a result, a dielectric material formed of the composite sintered body can be obtained.

Here, a calcination atmosphere can be selected arbitrarily. For example, in a case where conductive silicon carbide (SiC) particles, conductive molybdenum (Mo) particles, conductive tungsten (W) particles, or conductive tantalum (Ta) particles are used as the conductive particles, it is necessary to prevent the conductive particles from being oxidated, a non-oxidative atmosphere such as argon (Ar) atmosphere or nitrogen ($N_2$) atmosphere is preferable.

The reason for limiting the pressure during the calcination to be 1 MPa or higher and 100 MPa or lower is as follows. When the pressure is lower than 1 MPa, the sintered density of the obtained composite sintered body decreases, and the corrosion resistance may deteriorate. In addition, a dense sintered body cannot be obtained, and the conductivity is increased. Therefore, when this sintered body is used as a member for a semiconductor manufacturing device, the use thereof is limited, and the versatility may deteriorate. On the other hand, when the pressure is higher than 100 MPa, there is no problem in the sintered density and conductivity of the obtained composite sintered body. However, when a device for calcinating a large composite sintered body is designed in consideration of an increase in the size of a component for a semiconductor device, there may be a limit in the area of a pressure-applied region.

In addition, the calcination temperature can be set to be a typical calcination temperature used for the insulating material. For example, in a case where aluminum oxide ($Al_2O_3$)

is used as the insulating material, the calcination temperature is preferably 1500° C. or higher and 1900° C. or lower.

Here, the reason why it is preferable that the body obtained by using aluminum oxide ($Al_2O_3$) as the insulating material is calcinated at 1500° C. or higher and 1900° C. or lower is as follows. When the calcination temperature is lower than 1500° C., a dense composite sintered body may not be obtained due to insufficient sintering. On the other hand, when the calcination temperature is higher than 1900° C., for example, abnormal particle growth may occur due to excessive sintering. As a result, a dense composite sintered body may not be obtained.

In addition, the calcination time is not particularly limited as long as it is sufficient for obtaining a dense composite sintered body. For example, the calcination time is about 1 hour to 6 hours.

In the dielectric material according to the embodiment obtained as described above, the insulating material and the conductive particles are uniformly dispersed without forming a solid solution, a reaction product, or the like. As a result, the dielectric constant of the dielectric material can be increased without a decrease in the insulating characteristics of the insulating material. Accordingly, high insulating characteristics ad high dielectric constant can be realized in a wide temperature range.

Based on the above-described configurations, the dielectric material according to the embodiment has a small in-plane variation in dielectric loss and can be suitably used as a base body for an electrostatic chucking device.

In the dielectric material according to the embodiment, the dielectric constant of a composite sintered body, which is obtained by dispersing the conductive particles in the insulating material, at a frequency of 40 Hz is 10 or higher, and a difference between a maximum dielectric loss value and a minimum dielectric loss value at a frequency of 1 MHz in a surface of the composite sintered body is 0.002 or less. Therefore, by controlling the dielectric constant of the composite sintered body and a difference between a maximum dielectric loss value and a minimum dielectric loss value in the composite sintered body, the electrostatic adsorption force, desorption response, and withstand voltage can be improved, and a difference in the in-plane temperature of the composite sintered body can be minimized. Accordingly, the reliability of the dielectric material can be improved.

In the dielectric material, one or plural characteristics are suitably controlled among the volume resistivity, the withstand voltage, the thermal conductivity, and the dielectric loss at a frequency of 40 Hz. As a result, the electrostatic adsorption force, desorption response, and withstand voltage can be further improved, and a temperature difference in a surface of the composite sintered body can be eliminated. Accordingly, the reliability of the dielectric material can be maintained for a long period of time.

[Electrostatic Chucking Device]

FIG. 1 is a cross-sectional view showing an example of an electrostatic chucking device according to an embodiment of the present invention. In an electrostatic chucking device 1, a top surface (first main surface) 2a is a placement surface on which various wafers (plate-shaped samples) W such as a silicon wafer are placed. Therefore, an electrostatic chuck portion 4 includes: an electrostatic chuck member (base body) 2; and an electrode 3 for electrostatic adsorption that is provided on a bottom surface (second main surface) 2b of the electrostatic chuck member 2. A sheet-shaped or film-shaped insulating layer 6 is adhered to the electrode 3 for electrostatic adsorption through a sheet-shaped or film-shaped (first organic adhesive layer) 5. A base portion (base) 8, which supports the electrostatic chuck portion 4 and adjusts the temperature of a wafer W, is adhered to the sheet-shaped or film-shaped insulating layer 6 and the electrostatic chuck portion 4 through a sheet-shaped or film-shaped (second organic adhesive layer) 7.

Hereinafter, this electrostatic chucking device 1 will be described in detail.

The electrostatic chuck member 2 is a disk-shaped member including the dielectric material according to the embodiment. The thickness of the electrostatic chuck member 2 is preferably 0.3 mm or more and 5 mm or less and more preferably 0.4 mm or more and 3 mm or less. The reason for this is as follows. When the thickness of the electrostatic chuck member 2 is less than 0.3 mm, the mechanical strength of the electrostatic chuck member 2 may not be secured. On the other hand, when the thickness of the electrostatic chuck member 2 is more than 5 mm, the distance between the top surface 2a on which the wafer W is adsorbed and the electrode 3 for electrostatic adsorption increases, and the adsorption force decreases. Due to the decrease, the heat capacity of the electrostatic chuck member 2 increases, the heat exchange efficiency with the wafer W to be placed decreases, and it is difficult to maintain the in-plane temperature of the wafer W in a desired temperature pattern.

In order to improve characteristics relating to the temperature distribution of the electrostatic chucking device 1, the surface roughness Ra of the top surface 2a on which the wafer W of the electrostatic chuck member 2 is placed is preferably more than 0.002 μm and more preferably more than 0.005 μm.

Here, the reason for limiting the surface roughness Ra of the top surface 2a to be more than 0.002 μm is as follows. It is not preferable that the surface roughness Ra is 0.002 μm or less because the heat transfer effect on the top surface 2a is insufficient.

On the other hand, in order to eliminate defects of the electrostatic chucking device 1 caused by the formation of particles, it is preferable to mirror-polish the top surface 2a of the electrostatic chuck member 2 on which the wafer W is placed. The surface roughness Ra of the top surface 2a is preferably 0.5 μm or less and more preferably 0.15 μm or less.

In addition, a flow path for circulating a heat medium such as He gas or $N_2$ gas may be formed between the top surface 2a of the electrostatic chuck member 2, that is, the adsorption surface of the wafer W and the wafer W.

Further, either or both of a protrusion and a groove may be formed on the top surface 2a of the electrostatic chuck member 2 such that the top surface 2a is concavo-convex.

The electrode 3 for electrostatic adsorption is used as an electrode for an electrostatic chuck which fixes the wafer W to the top surface 2a of the electrostatic chuck member 2 through electrostatic adsorption force. The shape and size of the electrode 3 for electrostatic adsorption are appropriately adjusted according to the intended use.

Examples of a material constituting the electrode 3 for electrostatic adsorption, which can be preferably used include: non-magnetic metal having conductivity such as gold (Au), silver (Ag), or copper (Cu); high melting point metal such as titanium, tungsten, molybdenum, or platinum; a carbon material such as graphite or carbon; a conductive ceramic such as silicon carbide (SiC), titanium nitride (TiN), titanium carbide (TiC), or tungsten carbide (WC); and a cermet such as a TiC—Ni cermet, a TiC—Co cermet, or $B_4C$—Fe cermet. It is preferable that the thermal expansion coefficient of these materials approaches the thermal expansion coefficient of the electrostatic chuck member 2 as close as possible.

The thickness of the electrode 3 for electrostatic adsorption is not particularly limited. For example, in a case where the electrode 3 for electrostatic adsorption is used as an electrode for generating plasma, the thickness thereof is preferably 5 μm or more and 200 μm or less and more preferably 10 μm or more and 100 μm or less. The reason for this is as follows. When the thickness of the electrode 3 for electrostatic adsorption is less than 5 μm, sufficient conductivity may not be secured. On the other hand, when the thickness of the electrode 3 for electrostatic adsorption is more than 200 μm, a joint interface between the electrostatic chuck member 2 and the electrode 3 for electrostatic adsorption is likely to crack due to a difference in thermal expansion coefficient between the electrostatic chuck member 2 and the electrode 3 for electrostatic adsorption. In addition, the entire region of the bottom surface of the electrode 3 for electrostatic adsorption cannot be covered with the organic adhesive layer 5, and the insulating characteristics of the electrode 3 for electrostatic adsorption in a side surface direction may deteriorate.

The electrode 3 for electrostatic adsorption having a thickness in the above-described range can be easily formed using a film forming method such as sputtering or vapor deposition or a coating method such as screen printing.

In the electrostatic chuck portion 4, the wafer W is placed on the top surface 2*a*, and by applying a predetermined voltage between the wafer W and the electrode 3 for electrostatic adsorption, the wafer W can be adsorbed and fixed to the top surface 2*a* of the electrostatic chuck member 2 using electrostatic force.

The organic adhesive layer 5 is a sheet-shaped or film-shaped adhesive which is formed of acryl, epoxy, or polyethylene, and is preferably a thermal compression bonding type organic adhesive layer sheet or film.

The reason why the thermal compression bonding type organic adhesive layer sheet or film is preferable is as follows. By laminating the thermal compression bonding type organic adhesive layer sheet or film on the electrode 3 for electrostatic adsorption, performing vacuum drawing, and thermally compressing the laminate, bubbles and the like are not likely to be generated between the organic adhesive layer sheet or film and the electrode 3 for electrostatic adsorption. Accordingly, peeling is not likely to occur, and the adsorption characteristics and withstand voltage characteristics of the electrostatic chuck portion 4 can be maintained satisfactorily.

The thickness of the organic adhesive layer 5 is not particularly limited. In consideration of adhesion strength, handleability, and the like, the thickness of the organic adhesive layer 5 is preferably 5 μm or more and 100 μm or less and more preferably 10 μm or more and 50 μm or less.

When the thickness of the organic adhesive layer 5 is 5 μm or more and 100 μm or less, the adhesion strength between the organic adhesive layer 5 and the bottom surface of the electrode 3 for electrostatic adsorption is improved, and the thickness of the organic adhesive layer 5 becomes more uniform. As a result, the heat transfer coefficient between the electrostatic chuck member 2 and the base portion 8 is uniform, heating characteristics or cooling characteristics of the placed wafer W are uniformized, and the in-plane temperature of the wafer W is uniformized.

When the thickness of the organic adhesive layer 5 is less than 5 μm, the heat transference between the electrostatic chuck portion 4 and the base portion 8 is improved, but the thickness of the organic adhesive layer 5 may be excessively small. Therefore, the adhesion strength between the organic adhesive layer 5 and the bottom surface of the electrode 3 for electrostatic adsorption is weakened, and the organic adhesive layer 5 and the bottom surface of the electrode 3 for electrostatic adsorption are likely to be peeled off from each other, which is not preferable. On the other hand, when the thickness of the organic adhesive layer 5 is more than 100 μm, the thickness may be excessively large. Therefore, the heat transference between the electrostatic chuck portion 4 and the base portion 8 may not be sufficiently secured, and the heating efficiency or cooling efficiency during the temperature adjustment of the wafer W may deteriorate, which is not preferable.

As described above, by using a sheet-shaped or film-shaped adhesive as the organic adhesive layer 5, the thickness of the organic adhesive layer 5 is uniformized, and the heat transfer coefficient between the electrostatic chuck member 2 and the base portion 8 becomes uniform. Accordingly, due to the improvement of the function of adjusting the temperature of the wafer W, the heating characteristics or cooling characteristics are uniformized, and the in-plane temperature of the wafer W is uniformized.

In order to form the insulating layer 6, a sheet-shaped or film-shaped insulating material formed of an insulating resin which can endure an applied voltage of the electrostatic chuck portion 4, for example, polyimide, polyamide, or an aromatic polyamide is suitably used. The outer periphery of the insulating layer 6 is positioned inside the outer periphery of the electrostatic chuck member 2.

By providing the insulating layer 6 to be positioned inside the electrostatic chuck member 2, the plasma resistance of the insulating layer 6 to oxygen plasma and the corrosion resistance to corrosive gas are improved, and the generation of particles is suppressed.

The thickness of the insulating layer 6 is preferably 40 μm or more and 200 μm or less and more preferably 50 μm or more and 100 μm or less.

The reason for this is as follows. When the thickness of the insulating layer 6 is less than 40 μm, the insulating characteristics from the electrode 3 for electrostatic adsorption deteriorate, the electrostatic adsorption force is weakened, and the wafer W may not be satisfactorily fixed to the top surface 2*a* (placement surface). On the other hand, when the thickness of the insulating layer 6 is more than 200 μm, the heat transference between the electrostatic chuck portion 4 and the base portion 8 cannot be sufficiently secured, the function of adjusting the temperature of the wafer W, that is, the heating efficiency or cooling efficiency may deteriorate.

Through the organic adhesive layer 7, the electrostatic chuck portion 4 and the insulating layer 6 are adhered and fixed to the base portion 8. The organic adhesive layer 7 protects the electrode 3 for electrostatic adsorption, the organic adhesive layer 5 and the insulating layer 6 from oxygen plasma or corrosive gas by being provided so as to cover them. It is preferable that the organic adhesive layer 7 is formed of a material having high plasma resistance, high thermal conductivity, and a high temperature adjustment efficiency, that is, a high heating efficiency or a high cooling efficiency of the base portion 8. For example, a silicone resin composition which is a resin having satisfactory heat resistance and elasticity is preferable.

This silicone resin composition is a silicon compound having a siloxane bond (Si—O—Si). For example, a silicone resin having a thermal curing temperature of 70° C. to 140° C. is preferably used.

Here, it is not preferable that the thermal curing temperature is lower than 70° C. because, when the electrostatic chuck portion 4 and the insulating layer 6 are adhered to the base portion 8, curing starts in the process of the adhesion, which may interfere with the adhesion operation. On the other hand, it is not preferable that the thermal curing temperature is higher than 140° C. because a difference in thermal expansion coefficient between the electrostatic chuck portion 4, the insulating layer, 6 and the base portion 8 may be intolerable. As a result, not only the flatness of the placement surface of the electrostatic chuck member 2 but also the adhesion force between the electrostatic chuck portion 4, the insulating layer 6, and the base portion 8 deteriorate, and peeling may occur therebetween.

The thermal conductivity of the organic adhesive layer 7 is preferably 0.25 W/mk or higher and more preferably 0.5 W/mk or higher.

Here, the reason for limiting the thermal conductivity of the organic adhesive layer 7 to be 0.25 W/mk or higher is as follows. When the thermal conductivity is lower than 0.25 W/mk, the temperature adjustment efficiency, that is, the heating efficiency or cooling efficiency of the base portion 8 deteriorates, and the wafer W placed on the top surface 2a of the electrostatic chuck portion 4 may not be efficiently heated or cooled.

The thickness of the organic adhesive layer 7 is preferably 50 μm or more and 500 μm or less.

The reason for this is as follows. When the thickness of the organic adhesive layer 7 is less than 50 μm, the organic adhesive layer 7 is excessively thin. As a result, the adhesion strength cannot be sufficiently secured, and peeling or the like may occur between the insulating layer 6 and the electrostatic chuck portion 4, and the base portion 8. On the other hand, when the thickness of the organic adhesive layer 7 is more than 500 μm, the heat transference between the insulating layer 6 and the electrostatic chuck portion 4, and the base portion 8 cannot be sufficiently secured, and the heating efficiency or cooling efficiency may deteriorate.

Further, the thermal conductivity of the organic adhesive layer 7 is equal to or more than the thermal conductivity of the organic adhesive layer 5 and the thermal conductivity of the insulating layer 6. Thus, an increase in the temperature of the organic adhesive layer 7 can be suppressed, and a variation in in-plane temperature caused by a variation in the thickness of the organic adhesive layer 7 can be reduced. As a result, the temperature of the wafer W to be placed can be uniformized, and the in-plane temperature of the wafer W can be uniformized, which is preferable.

It is preferable that the organic adhesive layer 7 contains a filler having an average particle size of 1 μm or more and 10 μm or less, for example, surface-coated aluminum nitride (AlN) particles formed by forming a coating layer formed of silicon oxide ($SiO_2$) on surfaces of aluminum nitride (AlN) particles.

The surface-coated aluminum nitride (AlN) particles are incorporated in order to improve the thermal conductivity of the silicone resin, and by adjusting a mix rate thereof, a heat transfer coefficient of the organic adhesive layer 7 can be controlled.

The base portion 8 is a disk-shaped thick member for heating or cooling the wafer W placed on the electrostatic chuck portion 4 to adjust the temperature thereof. By heating or cooling the electrostatic chuck portion 4 through the organic adhesive layer 5, the insulating layer 6, and the organic adhesive layer 7, the wafer W can be adjusted to have a desired temperature pattern. The base portion 8 is connected to an external high frequency power supply (not shown). In the base portion 8, optionally, a flow path is formed through which water for cooling, for heating, or for temperature adjustment or an insulating heat medium or coolant is circulated.

A material constituting the base portion 8 is not particularly limited as long as it is metal or a metal-ceramic compound material having satisfactory thermal conductivity, electric conductivity, and workability. For example, aluminum (Al), copper (Cu), or stainless steel (SUS) is preferably used. It is preferable that a side surface of the base portion 8, that is, at least a surface exposed to plasma undergoes an alumite treatment or is coated with an insulating thermal sprayed material such as aluminum oxide or yttrium oxide.

In the base portion 8, an alumite treatment is performed or an insulating film is formed on at least the surface exposed to plasma. As a result, plasma resistance is improved, abnormal discharge is prevented, and thus plasma resistance stability is improved. In addition, since the surface is resistant to scratches, the formation of scratches can be preferably prevented.

In the electrostatic chucking device 1, the heat transfer coefficient between the electrostatic chuck portion 4 and the base portion 8 is preferably 100 $W/m^2 \cdot K$ or higher and 3000 $W/m^2 \cdot K$ or lower and more preferably 300 $W/m^2 \cdot K$ or higher and 1000 $W/m^2 \cdot K$ or lower.

Here, the reason for limiting the heat transfer coefficient to be 100 $W/m^2 \cdot K$ or higher is that, when the temperature of the electrostatic chuck portion 4 formed of the dielectric material is controlled using the base portion 8, the response can be secured. On the other hand, the reason for limiting the heat transfer coefficient to be 3000 $W/m^2 \cdot K$ or lower is as follows. When the heat transfer coefficient between the base portion 8 and the electrostatic chuck portion 4 is higher than 3000 $W/m^2 \cdot K$, the amount of heat generated from the base portion 8 is scattered from the joint portion to the peripheral portions without being transferred to the electrostatic chuck portion 4, and thus it is difficult to control the temperature of a region near the outer periphery.

In the electrostatic chucking device 1, it is preferable that a difference between a maximum value and a minimum value regarding the heat transfer coefficient between the electrostatic chuck portion 4 and the base portion 8 in a surface is 100 $W/m^2 \cdot K$ or lower. The reason for this is that, when the difference between the maximum value and the minimum value is higher than 100 W/m2·K, the temperature of the base portion 8 cannot be uniformly transferred to the inside of the adsorption surface.

In the electrostatic chucking device 1, a heater for heating the electrostatic chuck portion 4 may be provided in the organic adhesive layer 7 between the electrostatic chuck portion 4 and the base portion 8. It is preferable that the heater is thin in order to reduce the thickness of the organic adhesive layer 7.

In addition, in order to generate heat using a high frequency, it is preferable that the heater is formed of non-magnetic metal or a conductive ceramic.

In the electrostatic chucking device 1 according to the embodiment, the disk-shaped electrostatic chuck member 2 is formed of the dielectric material according to the embodiment. Therefore, the electrostatic adsorption force and desorption response of the plate-shaped sample W can be improved, and the withstand voltage of the electrostatic chuck member 2 can be improved. Further, a temperature difference in the top surface 2a of the electrostatic chuck member 2 on which the plate-shaped sample W is electrostatically adsorbed can be minimized. Accordingly, various processes can be uniformly performed on the entire region of the plate-shaped sample W, and the reliability of the obtained product can be improved.

Figure 2:
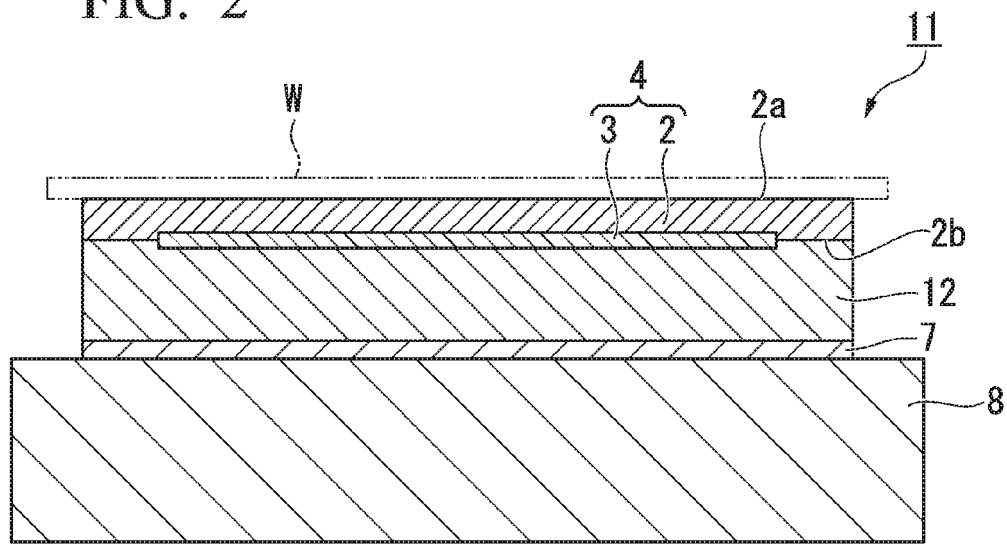
FIG. 2 is a cross-sectional view showing a modification example of the electrostatic chucking device according to the embodiment of the present invention.

FIG. 2 is a cross-sectional view showing a modification example of the electrostatic chucking device according to the embodiment of the present invention. A electrostatic chucking device 11 is different from the above-described electrostatic chucking device 1, in that: a supporting plate 12 formed of an insulating ceramic is provided so as to cover the bottom surface of the electrode 3 for electrostatic adsorption; and the supporting plate 12 is integrated with the electrostatic chuck member 2 and is adhered to the base portion 8 through the organic adhesive layer 7. Since points other than the above-described points are the same as those of the above-described electrostatic chucking device 1, the description thereof will not be repeated.

The insulating ceramic which is the component of the supporting plate 12 may have a composition which is the same as or different from that of the insulating ceramic used in the above-described electrostatic chuck member 2.

In particular, in order to prevent the occurrence of warpage or fine cracks caused by a difference in thermal expansion coefficient between the supporting plate 12 and the electrostatic chuck member 2, it is preferable that a difference in thermal expansion coefficient between the insulating ceramics, which are used in the supporting plate 12 and the electrostatic chuck member 2, respectively, is 10% or less. In this case, it is more preferable that the insulating ceramics used in the supporting plate 12 and the electrostatic chuck member 2, respectively have the same composition.

In addition, even in the insulating material, heat is generated by a high frequency. Therefore, it is preferable that the insulating ceramic used has a variation of 0.002 or less when the dielectric loss is measured at a frequency of 1 MHz.

There are various methods of integrating the supporting plate 12 and the electrostatic chuck member 2. For example, the following methods can be used.
(1) A method of integrating the electrostatic chuck member 2, the electrode 3 for electrostatic adsorption, and the supporting plate 12, the method including: applying an electrode material for forming the electrode 3 for electrostatic adsorption to the bottom surface 2b of the electrostatic chuck member 2; placing a body having a predetermined shape, into which an insulating ceramic powder for forming the supporting plate 12 is formed, so as to cover the electrode material; and calcinating the components at a predetermined temperature.
(2) A method of integrating the electrostatic chuck member 2, the electrode 3 for electrostatic adsorption, and the supporting plate 12, the method including: applying an electrode material for forming the electrode 3 for electrostatic adsorption to the bottom surface 2b of the electrostatic chuck member 2; applying materials, which include an insulating ceramic powder for forming the supporting plate 12, to a region of the bottom surface 2b of the electrostatic chuck member 2 to which the electrode material is not applied; and hot-pressing the components at a predetermined temperature under a predetermined pressure.

In the obtained electrostatic chucking device 11 obtained using one of the above-described methods, the thickness of the ceramic members including the supporting plate 12 and the electrostatic chuck member 2 is preferably 5 mm or less and more preferably 3 mm or less. The lower limit value can be selected arbitrarily, but is preferably 0.1 mm or more.

By adjusting the thickness of the ceramic members to be 5 mm or less, the amount of heat generated by dielectric loss can be reduced, and the temperature distribution can be made to be more uniform.

In a cases where it is necessary to heat a plate-shaped sample placed on the electrostatic chucking device 11, a heater for heating the plate-shaped sample may be embedded in either or both of the supporting plate 12 and the electrostatic chuck member 2.

Here, in a case where the heater is embedded, the thickness of the ceramic members including the supporting plate 12 and the electrostatic chuck member 2 is preferably 7 mm or less and more preferably 5 mm or less.

Even the electrostatic chucking device 11 can exhibit the same effect and operation as in the above-described electrostatic chucking device 1.

However, since the bottom surface of the electrode 3 for electrostatic adsorption is covered with the supporting plate 12 formed of the insulating ceramic, warpage during a temperature increase can be reduced.

In addition, since the supporting plate 12 is also formed of an insulating ceramic, the durability of the electrostatic chucking device 11 can be improved.

EXAMPLES

Hereinafter, the present invention will be described in detail using Examples and Comparative Examples, but is not limited to the following Examples.

Example 1

A silicon carbide (SiC) powder having an average particle diameter of 0.03 µm, a silicon carbide (SiC) powder having an average particle diameter of 0.05 µm, a silicon carbide (SiC) powder having an average particle diameter of 0.1 µm are mixed with each other at a mass ratio of 1:1:1 to obtain mixed silicon carbide (SiC) powder.

Next, 8% by mass of the mixed silicon carbide (SiC) powder and 92% by mass of an aluminum oxide ($Al_2O_3$) powder having an average particle diameter of 0.1 µm were weighed, 72 parts by mass of water was added thereto with respect to 100 parts by mass of the total mass of the powders, and the components were stirred. As a result, a slurry was obtained.

Next, this slurry was put into a wet jet mill (HJP-25010, manufactured by Sugino Machine Ltd.) and was compressed under a pressure of 150 MPa such that particles of the slurry collide against each other in an oblique direction. As a result, the components were dispersed for 120 minutes, and a dispersion liquid was obtained.

Next, this dispersion liquid was dried by being sprayed using a spray dryer at 200° C. As a result, an $Al_2O_3$—SiC composite powder was obtained in which the content rate of aluminum oxide ($Al_2O_3$) was 92% by mass.

Next, this $Al_2O_3$—SiC composite powder was formed into a predetermined shape using a forming machine. Next, this body was interposed between carbon plates having a flatness of 0.1 mm. In a state of being interposed between the carbon plates, the body was put into a hot press machine and was calcinated in an argon (Ar) atmosphere at 1650° C. under a pressure of 25 MPa for 2 hours. As a result, an $Al_2O_3$—SiC composite sintered body was obtained.

Next, this composite sintered body was machined and processed into a disk shape having a diameter of 300 mm and a thickness of 1.0 mm. As a result, a dielectric plate formed of the $Al_2O_3$—SiC composite sintered body according to Example 1 was prepared.

Example 2

A dielectric plate formed of the $Al_2O_3$—SiC composite sintered body according to Example 2 was prepared using the same method as in Example 1, except that 11% by mass of the mixed silicon carbide (SiC) powder and 89% by mass of an aluminum oxide ($Al_2O_3$) powder were weighed.

Example 3

A dielectric plate formed of the $Al_2O_3$—SiC composite sintered body according to Example 3 was prepared using the same method as in Example 1, except that 9% by mass of the mixed silicon carbide (SiC) powder and 91% by mass of an aluminum oxide ($Al_2O_3$) powder were weighed.

Example 4

A dielectric plate formed of the $Al_2O_3$—SiC composite sintered body according to Example 4 was prepared using the same method as in Example 1, except that: 9% by mass of the mixed silicon carbide (SiC) powder and 91% by mass of an aluminum oxide ($Al_2O_3$) powder having an average particle diameter of 0.1 μm were weighed; and the calcination temperature was changed to 1800° C.; and the pressure was changed to 40 MPa.

Example 5

A silicon carbide (SiC) powder having an average particle diameter of 0.03 μm, a silicon carbide (SiC) powder having an average particle diameter of 0.05 μm, a silicon carbide (SiC) powder having an average particle diameter of 0.1 μm are mixed with each other at a mass ratio of 1:2:1 to obtain mixed silicon carbide (SiC) powder. A dielectric plate formed of the $Al_2O_3$—SiC composite sintered body according to Example 5 was prepared using the same method as in Example 1, except that: 10% by mass of the mixed silicon carbide (SiC) powder and 90% by mass of an aluminum oxide ($Al_2O_3$) powder having an average particle diameter of 0.1 μm were weighed.

Example 6

A dielectric plate formed of the $Al_2O_3$—SiC composite sintered body according to Example 6 was prepared using the same method as in Example 1, except that 12% by mass of the mixed silicon carbide (SiC) powder and 88% by mass of an aluminum oxide ($Al_2O_3$) powder were weighed.

Example 7

A silicon carbide (SiC) powder having an average particle diameter of 0.03 μm, a silicon carbide (SiC) powder having an average particle diameter of 0.05 μm, a silicon carbide (SiC) powder having an average particle diameter of 0.1 μm are mixed with each other at a mass ratio of 1:1:1 to obtain mixed silicon carbide (SiC) powder.

Next, 10% by mass of the mixed silicon carbide (SiC) powder and 90% by mass of a yttrium oxide ($Y_2O_3$) powder having an average particle diameter of 0.1 μm were weighed, 72 parts by mass of water was added thereto with respect to 100 parts by mass of the total mass of the powders, and the components were stirred. As a result, a slurry was obtained.

Next, this slurry was put into a wet jet mill and was compressed under a pressure of 150 MPa such that particles of the slurry collide against each other in an oblique direction. As a result, the components were dispersed, and a dispersion liquid was obtained.

Next, this dispersion liquid was dried by being sprayed using a spray dryer at 200° C. As a result, an $Y_2O_3$—SiC composite powder was obtained in which the content rate of yttrium oxide ($Y_2O_3$) was 90% by mass.

Next, this $Y_2O_3$—SiC composite powder was formed into a predetermined shape using a forming machine. Next, this body was interposed between carbon plates having a flatness of 0.1 mm. In a state of being interposed between the carbon plates, the body was put into a hot press machine and was calcinated in an argon (Ar) atmosphere at 1500° C. under a pressure of 20 MPa for 2 hours. As a result, a $Y_2O_3$—SiC composite sintered body according to Example 7 was obtained.

Next, this composite sintered body was machined and processed into a disk shape having a diameter of 300 mm and a thickness of 1.0 mm. As a result, a dielectric plate formed of the $Y_2O_3$—SiC composite sintered body according to Example 7 was prepared.

Comparative Example 1

A dielectric plate formed of the $Al_2O_3$—SiC composite sintered body according to Comparative Example 1 was prepared using the same method as in Example 1, except that: a silicon carbide (SiC) powder having an average particle diameter of 0.05 μm was used instead of the mixed silicon carbide (SiC) powder; and 8% by mass of the silicon carbide (SiC) powder and 92% by mass of an aluminum oxide ($Al_2O_3$) powder having an average particle diameter of 0.1 μm were weighed.

Comparative Example 2

A dielectric plate formed of the $Al_2O_3$—SiC composite sintered body according to Comparative Example 2 was prepared using the same method as in Example 1, except that: a silicon carbide (SiC) powder having an average particle diameter of 0.03 μm was used instead of the mixed silicon carbide (SiC) powder; and 10% by mass of the silicon carbide (SiC) powder and 90% by mass of an aluminum oxide ($Al_2O_3$) powder having an average particle diameter of 0.1 μm were weighed.

Comparative Example 3

A dielectric plate formed of the $Al_2O_3$—SiC composite sintered body according to Comparative Example 3 was prepared using the same method as in Example 1, except that: a silicon carbide (SiC) powder having an average particle diameter of 0.05 μm was used instead of the mixed silicon carbide (SiC) powder; 9% by mass of the silicon carbide (SiC) powder and 91% by mass of an aluminum oxide ($Al_2O_3$) powder having an average particle diameter of 0.1 μm were weighed; the calcination temperature was changed to 1800° C.; and the pressure was changed to 40 MPa.

Comparative Example 4

A dielectric plate formed of the $Al_2O_3$—SiC composite sintered body according to Comparative Example 4 was prepared using the same method as in Example 1, except that: a silicon carbide (SiC) powder having an average particle diameter of 0.03 μm was used instead of the mixed silicon carbide (SiC) powder; and 12% by mass of the silicon carbide (SiC) powder and 88% by mass of an aluminum oxide ($Al_2O_3$) powder having an average particle diameter of 0.1 μm were weighed.

Comparative Example 5

A dielectric plate formed of the $Al_2O_3$—SiC composite sintered body according to Comparative Example 5 was prepared using the same method as in Example 1, except that: a silicon carbide (SiC) powder having an average particle diameter of 0.03 μm was used instead of the mixed silicon carbide (SiC) powder; and 32% by mass of the silicon carbide (SiC) powder and 68% by mass of an aluminum oxide ($Al_2O_3$) powder having an average particle diameter of 0.1 μm were weighed.

[Evaluation of Dielectric Plate]

Regarding each of the dielectric plates according to Examples 1 to 7 and Comparative Examples 1 to 5, the volume resistivity, dielectric constant, dielectric loss, withstand voltage, and temperature distribution were evaluated.

Here, at five points in total including the center of the dielectric plate having a diameter of 300 mm and a thickness of 1.0 mm and four points (0°, 90°, 180°, and 270°) obtained by quadrisecting an outer periphery thereof at intervals of 90°, the volume resistivity, dielectric constant, dielectric loss, withstand voltage, and temperature distribution were evaluated. In the outer periphery, positions at a distance of 10 mm from an edge to the inside was measured.

Methods of evaluation the respective items are as follows.

(1) Volume Resistivity

The volume resistivity was measured using a three-terminal method with a digital ultrahigh resistance-micro current Meter R83040A (manufactured by Advantest Corporation). Here, an applied voltage was set as 500 V, and a volume resistivity was calculated based on a current value which was measured when the voltage was maintained for 60 seconds. The average volume resistivity at the five measurement points is shown in Table 1. It is preferable that the volume resistivity is $10^{13}$ Ω·cm or higher. At this time, the temperature during the measurement was 20° C.

(2) Dielectric Constant and Dielectric Loss

Using a dielectric constant measuring system 126096W (manufactured by Toyo Corporation), a dielectric constant at 40 Hz and dielectric losses at 40 Hz and 1 MHz were measured. The average dielectric constant at the five measurement points is shown in Table 1. In addition, the respective average dielectric loss values at the five measurement points are shown in Table 2. It is preferable that a dielectric loss at a frequency of 40 Hz is 0.01 or higher and 0.05 or lower, and it is preferable that a dielectric constant at a frequency of 40 Hz is 10 or higher.

(3) Withstand Voltage

A dielectric plate was interposed between silicon wafers having a size of 35 mm×35 mm such that creeping discharge did not occur between electrodes. The voltage was increased by 1 kV/mm until 10 kV/mm and, after 10 kV/mm, was increased to a predetermined measurement voltage by 0.5 kV/mm. After the predetermined measurement voltage was maintained for 1 minute, a current value was measured. In this case, in a case where the current value after the maintenance for 1 minute was the same as that at the beginning of the maintenance, the voltage was further increased. In a case where the current value after the maintenance for 1 minute was higher than that at the beginning of the maintenance, the applied voltage was set as a withstand voltage value. The measurement results are shown in Table 1. It is preferable that a withstand voltage of the dielectric material is 5 kV/mm or higher. At this time, the temperature during the measurement was 20° C.

(4) Temperature Distribution

In order to investigate temperature uniformity in the dielectric plate, a temperature distribution in a surface of the dielectric plate was measured and evaluated.

Here, using the dielectric plate, the electrostatic chuck member 2 of the electrostatic chucking device 1 shown in FIG. 1 was prepared. By applying a high frequency of 13.56 MHz to the electrostatic chuck member 2, a temperature distribution in a surface was measured by infrared thermography, and a difference between a maximum temperature and a minimum temperature was calculated. The results of the temperature difference are shown in Table 1 as a temperature distribution. The less the temperature distribution, the better.

TABLE 1

| | Volume Resistivity (Ω · cm) | Dielectric Constant | Withstand Voltage (kV/mm) | Temperature Distribution (ΔK) |
|---|---|---|---|---|
| Example 1 | >$10^{13}$ | 14 | 14 | 2 |
| Example 2 | >$10^{13}$ | 19 | 8 | 3 |
| Example 3 | >$10^{13}$ | 15 | 12 | 2 |
| Example 4 | >$10^{13}$ | 11 | 7 | 2 |
| Example 5 | >$10^{13}$ | 14 | 15 | 2 |
| Example 6 | >$10^{13}$ | 20 | 7 | 3 |
| Example 7 | >$10^{13}$ | 15 | 7 | 3 |
| Comparative Example 1 | >$10^{13}$ | 15 | 14 | 13 |
| Comparative Example 2 | >$10^{13}$ | 16 | 12 | 13 |
| Comparative Example 3 | >$10^{13}$ | 12 | 7 | 12 |
| Comparative Example 4 | >$10^{13}$ | 22 | 5 | 10 |
| Comparative Example 5 | $10^2$ | <2 | <2 | Not Measured |

TABLE 2

| | 40 Hz | | | | | 1 MHz | | | | |
|---|---|---|---|---|---|---|---|---|---|---|
| | Center | 0° | 90° | 180° | 270° | Center | 0° | 90° | 180° | 270° |
| Example 1 | 0.0190 | 0.0200 | 0.0201 | 0.0200 | 0.0200 | 0.0050 | 0.0048 | 0.0048 | 0.0047 | 0.0050 |
| Example 2 | 0.0307 | 0.0333 | 0.0358 | 0.0389 | 0.0301 | 0.0045 | 0.0061 | 0.0060 | 0.0055 | 0.0060 |
| Example 3 | 0.0219 | 0.0212 | 0.0215 | 0.0219 | 0.0218 | 0.0045 | 0.0062 | 0.0055 | 0.0048 | 0.0050 |
| Example 4 | 0.0271 | 0.0180 | 0.0190 | 0.0222 | 0.0240 | 0.0047 | 0.0050 | 0.0051 | 0.0051 | 0.0050 |
| Example 5 | 0.0251 | 0.0223 | 0.0222 | 0.0222 | 0.0230 | 0.0041 | 0.0034 | 0.0035 | 0.0035 | 0.0038 |
| Example 6 | 0.0420 | 0.0401 | 0.0400 | 0.0405 | 0.0400 | 0.0048 | 0.0047 | 0.0047 | 0.0047 | 0.0048 |
| Example 7 | 0.0159 | 0.0160 | 0.0158 | 0.0158 | 0.0159 | 0.0016 | 0.0018 | 0.0016 | 0.0016 | 0.0018 |

TABLE 2-continued

|  | 40 Hz | | | | | 1 MHz | | | | |
| --- | --- | --- | --- | --- | --- | --- | --- | --- | --- | --- |
|  | Center | 0° | 90° | 180° | 270° | Center | 0° | 90° | 180° | 270° |
| Comparative Example 1 | 0.0020 | 0.0600 | 0.0200 | 0.0201 | 0.0060 | 0.0044 | 0.0070 | 0.0044 | 0.0044 | 0.0068 |
| Comparative Example 2 | 0.0251 | 0.0600 | 0.0450 | 0.0280 | 0.0280 | 0.0041 | 0.0065 | 0.0041 | 0.0040 | 0.0042 |
| Comparative Example 3 | 0.0271 | 0.0271 | 0.0266 | 0.0230 | 0.0760 | 0.0042 | 0.0044 | 0.0046 | 0.0044 | 0.0078 |
| Comparative Example 4 | 0.0401 | 0.0808 | 0.0403 | 0.0403 | 0.0403 | 0.0055 | 0.0080 | 0.0054 | 0.0055 | 0.0053 |
| Comparative Example 5 | | | | | Not Measured | | | | | |

It was found from Tables 1 and 2 that, in the dielectric plates according to Examples 1 to 6, the variation in dielectric loss was smaller than that of the dielectric plates according to Comparative Examples 1 to 4, and the temperature distribution during the application of a high frequency was narrowed.

In the dielectric plate according to Comparative Example 5, the volume resistivity was significantly reduced to $10^2$ Ω·cm, the dielectric constant was lower than 2, and the withstand voltage was lower than 2 kV/mm. Accordingly, the temperature distribution in the surface of the dielectric plate and the dielectric loss values at 40 Hz and 1 MHz were not measured.

Further, the electrostatic chucking device 1 was prepared using the dielectric plate according to Example 1, and the heat transfer coefficient between the electrostatic chuck member 2 and the base portion 8 was measured. The results are as follows: the average heat transfer coefficient was 625 W/m²·K; and a maximum heat transfer coefficient and a minimum heat transfer coefficient in a surface were 630 W/m²·K and 617 W/m²·K, respectively.

It was found that, by preparing the electrostatic chuck member 2 of the electrostatic chucking device 1 shown in FIG. 1 using the dielectric plate according to the embodiment as described above, an electrostatic chucking device in which a temperature distribution during the application of a high frequency is narrow can be provided.

INDUSTRIAL APPLICABILITY

It is possible to provide: an inexpensive dielectric material in which sufficient electrostatic adsorption force, satisfactory desorption response, and high withstand voltage are obtained and in which there is no temperature difference in a surface of a composite sintered body; and an electrostatic chucking device in which abase body is formed of the dielectric material.

EXPLANATION OF REFERENCE

1: ELECTROSTATIC CHUCKING DEVICE
2: ELECTROSTATIC CHUCK MEMBER (BASE BODY)
2a: TOP SURFACE (FIRST MAIN SURFACE)
2b: BOTTOM SURFACE
3: ELECTRODE FOR ELECTROSTATIC ADSORPTION
4: ELECTROSTATIC CHUCK PORTION
8: BASE PORTION
11: ELECTROSTATIC CHUCKING DEVICE
12: SUPPORTING PLATE
W: PLATE-SHAPED SAMPLE

The invention claimed is:

1. A dielectric material, wherein
the dielectric material is a composite sintered body in which conductive particles are dispersed in an insulating material,
the insulating material is at least one selected from the group consisting of aluminum oxide and yttrium oxide,
the conductive particles are silicon carbide particles,
the content of the conductive particles in the dielectric material is 4 to 20% by mass,
the conductive particles are a mixed conductive particles wherein plural kinds of conductive particles having different average particle diameters are mixed,
the mixture of conductive particles includes 1 to 40% by mass of conductive particles having a particle diameter of 40 nm or less and 1 to 40% by mass of the conductive particles having a particle diameter of 80 nm or more,
a dielectric constant of the dielectric material at a frequency of 40 Hz is 10 or higher, and
a difference between a maximum value and a minimum value of dielectric loss of the dielectric material wherein the dielectric loss is measured at a frequency of 1 MHz on the surface of the composite sintered body is 0.002 or less,
a volume resistivity at 20° C. of the dielectric material is $10^{13}$ Ω·cm or higher.

2. The dielectric material according to claim 1, wherein a withstand voltage at 20° C. of the dielectric material is 5 kV/mm or higher.

3. The dielectric material according to claim 1, wherein a thermal conductivity of the dielectric material is 20 W/m·K or higher.

4. The dielectric material according to claim 1, wherein dielectric loss at a frequency of 40 Hz of the dielectric material is 0.01 or higher and 0.05 or lower.

5. An electrostatic chuck device comprising
a base having a main surface on which a plate-like sample is electrostatically attracted,
wherein the base is formed of the dielectric material according to claim 1.

* * * * *